US009778289B2

(12) United States Patent
Dearborn et al.

(10) Patent No.: US 9,778,289 B2
(45) Date of Patent: Oct. 3, 2017

(54) MEASURING OUTPUT CURRENT IN A BUCK SMPS

(71) Applicant: Microchip Technology Incorporated, Chandler, AZ (US)

(72) Inventors: Scott Dearborn, Brackney, PA (US); Cliff Ellison, Campbell, NY (US)

(73) Assignee: MICROCHIP TECHNOLOGY INCORPORATED, Chandler, AZ (US)

( * ) Notice: Subject to any disclaimer, the term of this patent is extended or adjusted under 35 U.S.C. 154(b) by 35 days.

(21) Appl. No.: 14/883,381

(22) Filed: Oct. 14, 2015

(65) Prior Publication Data

US 2016/0109488 A1 Apr. 21, 2016

Related U.S. Application Data

(60) Provisional application No. 62/065,152, filed on Oct. 17, 2014.

(51) Int. Cl.
| | |
|---|---|
| *H02M 3/158* | (2006.01) |
| *G01R 19/00* | (2006.01) |
| *H02M 3/156* | (2006.01) |
| *H02M 1/00* | (2006.01) |

(52) U.S. Cl.
CPC ........ *G01R 19/0046* (2013.01); *H02M 3/156* (2013.01); *H02M 3/158* (2013.01); *H02M 3/1588* (2013.01); *H02M 2001/0009* (2013.01); *Y02B 70/1466* (2013.01)

(58) Field of Classification Search
CPC G01R 19/0046; H02M 3/156; H02M 3/1588; H02M 2001/0009; Y02B 70/1466

USPC ........................................................ 323/282
See application file for complete search history.

(56) References Cited

U.S. PATENT DOCUMENTS

| | | | |
|---|---|---|---|
| 7,274,183 B1 | 9/2007 | Gu et al. ........................ 323/288 |
| 7,362,191 B2 * | 4/2008 | Chen ........................ H02M 1/44 |
| | | | 331/78 |
| 7,460,441 B2 | 12/2008 | Bartling ........................ 368/118 |
| 7,764,213 B2 | 7/2010 | Bartling et al. ............... 341/152 |
| 2004/0183512 A1 * | 9/2004 | McCune, Jr. ......... H02M 3/155 |
| | | | 323/282 |

(Continued)

OTHER PUBLICATIONS

International Search Report and Written Opinion, Application No. PCT/US2015/055859, 11 pages, Feb. 15, 2016.

(Continued)

*Primary Examiner* — Julian Huffman
*Assistant Examiner* — Michael Konczal
(74) *Attorney, Agent, or Firm* — Slayden Grubert Beard PLLC

(57) ABSTRACT

A sample and hold circuit takes a sample of the current flowing through an inductor of a buck switched-mode power supply (SMPS) at substantially the middle of the low side portion (50 percent point during low side switch ON) of the pulse width modulation (PWM) period. This sample of the current through the SMPS inductor during the low side ON 50% point may be considered as the "average" or "DC output" current of the SMPS, and taken every time at precisely the same low side ON 50%. A constant current source and sink are used to charge and discharge a timing capacitor whose voltage charge is monitored by a high speed voltage comparator to provide precise sample timing.

19 Claims, 7 Drawing Sheets

(56) References Cited

U.S. PATENT DOCUMENTS

2010/0026270 A1  2/2010  Yang et al. .................. 323/299
2014/0002037 A1  1/2014  Babazadeh et al. .......... 323/271

OTHER PUBLICATIONS

Palmer, Mark, "AN564: Using the PWM," Microchip Technology Incorporated, 14 pages, Aug. 26, 1997.
Di Jasio, Lucio, "AN1050: A Technique to Increase the Frequency Resolution of PICmicro® MCU PWM Modules," Microchip Technology Incorporated, 10 pages, Jul. 21, 2006.
Bohn, Bruce, "AN1250: Microchip CTMU for Capacitive Touch Applications," Microchip Technology Incorporated, 22 pages, Jan. 16, 2009.
Yedamale, Padmaraja et al., "AN1375: See What You Can Do with the CTMU," Microchip Technology Incorporated, 12 pages, Feb. 18, 2011.

\* cited by examiner (a)

(b)

MEASURING OUTPUT CURRENT IN A BUCK SMPS

RELATED PATENT APPLICATION

This application claims priority to commonly owned U.S. Provisional Patent Application No. 62/065,152; filed Oct. 17, 2014; which is hereby incorporated by reference herein for all purposes.

TECHNICAL FIELD

The present disclosure relates to a switched-mode power supplies (SMPS), and, in particular, to accurate measurement of the output current in a buck SMPS.

BACKGROUND

Switch-Mode Power Supplies (SMPS) deliver a great deal of power while wasting very little, because the circuit elements of the SMPS are extremely efficient and dissipate very little power. In SMPSs, in particular, point-of-load (POL) converters, it is essential to provide a real time measurement of output current with a high degree of accuracy (1%-3% at full load) for maximum operating efficiency. Not only must this current measurement be accurate, but it must not impact the SMPS POL converter's efficiency or dynamic performance. Sensing and measuring current to such a high degree of accuracy (1%-3%) is an issue that has existed for many years in SMPS designs. No known solution exists today to satisfy this requirement that does not adversely affect the POL converter's efficiency.

SUMMARY

Hence there is a need for more accurate measurement of SMPS output current without degrading efficiency and/or dynamic performance of the SMPS.

According to an embodiment, a method for performing current measurement in a switched-mode power supply (SMPS) having high side and low side switches coupled in series between a supply voltage and common, and a power inductor coupled between a junction of the high side and low side switches and a load may comprise the steps of: charging a timing capacitor with a first constant current when the high side switch may be on; discharging the timing capacitor with the first constant current when a pulse width modulation (PWM) period reaches 50% and the high side switch may be on; discharging the timing capacitor with a second constant current when the PWM period reaches 50% and the high side switch may be off, wherein the second constant current may be twice the first constant current; and sampling the power inductor current when a voltage on the timing capacitor reaches a predetermined reference voltage.

According to a further embodiment of the method, the timing capacitor may not be charged or discharged when the high side switch may be off and the PWM period may be less than 50%. According to a further embodiment, pre-charging said capacitor to the reference voltage when the power inductor current may be sampled. According to a further embodiment, the step of converting the power inductor current sample into a digital representation thereof may be done with an analog-to-digital converter (ADC).

According to a further embodiment of the method, may comprise the steps of: averaging a plurality of the power inductor current samples; and converting the average of the plurality of the power inductor current samples into a digital representation thereof with an analog-to-digital converter (ADC).

According to a further embodiment of the method, the step of sampling the power inductor current may comprise the steps of: providing a current measurement resistor between the low side switch and the supply common; and sampling a voltage developed across the current measurement resistor when the voltage on the timing capacitor reaches the predetermined reference voltage.

According to a further embodiment of the method, the high side and low side switches may be power transistors. According to a further embodiment of the method, the power transistors may be metal oxide semiconductor field effect transistors (MOSFETs). According to a further embodiment of the method, the step of sampling the power inductor current may comprise the step of sampling a voltage developed across the low side MOSFET when the voltage on the timing capacitor reaches the predetermined reference voltage.

According to a further embodiment of the method, the step of sampling the power inductor current may comprise the steps of: providing a pilot field effect transistor (FET) associated with the low side MOSFET, wherein the pilot FET may have a small portion of the power inductor current flowing therethrough; and sampling a voltage developed across the pilot FET and the low side MOSFET when the voltage on the timing capacitor reaches the predetermined reference voltage. According to a further embodiment of the method, the step of sampling the power inductor current may comprise the steps of: providing a current measurement resistor in series with the power inductor; and sampling a voltage developed across the current measurement resistor when the voltage on the timing capacitor reaches the predetermined reference voltage. According to a further embodiment of the method, the step of sampling the power inductor current may comprise the step of sampling a voltage across the power inductor when the voltage on the timing capacitor reaches the predetermined reference voltage.

According to a further embodiment of the method, the predetermined threshold voltage may be approximately zero (0) volts. According to a further embodiment of the method, may comprise the step of generating a sample signal when the voltage on the timing capacitor reaches the predetermined reference voltage. According to a further embodiment of the method, may comprise the step of converting the power inductor current sample into a digital representation thereof with an analog-to-digital converter (ADC) every $n^{th}$ time the voltage on the timing capacitor reaches the predetermined reference voltage.

According to another embodiment, an apparatus for determining a power inductor current sample point in a buck switched-mode power supply (SMPS) may comprise: a constant current source having first and second nodes, wherein the first node thereof may be coupled to a voltage source; a constant current sink having first and second nodes, wherein the constant current sink may be twice the current value of the constant current source; a current source switch coupled between the second node of the constant current source and the first node of the constant current sink; a current sink switch coupled between the second node of the constant current sink and a voltage source common; a timing capacitor coupled between the first node of the constant current sink and the voltage source common; a voltage comparator having a first input coupled to a predetermined reference voltage, a second input coupled to the timing capacitor and an output, wherein the output thereof may be at a first logic level when the voltage on the timing capacitor may be greater than the predetermined reference voltage, and at a second logic level when the voltage on the timing capacitor may be equal to or less than the predetermined reference voltage; wherein when a high side switch signal from the SMPS goes to a first logic level the current source switch turns on and couples the constant current source to the timing capacitor, whereby a voltage on the timing capacitor increases; when the high side switch signal from the SMPS goes to a second logic level the current source switch turns off and decouples the constant current source from the timing capacitor, whereby the voltage on the timing capacitor stays the same; and when a 50% pulse width modulation (PWM) period signal from the SMPS may be received the current sink switch turns on and couples the constant current sink to the timing capacitor, whereby the voltage on the timing capacitor decreases twice as fast it increased when the high side switch signal may be at the second logic level, and when the high side switch signal may be at the first logic level the voltage on the timing capacitor decreases at the same rate as it increased.

According to a further embodiment, when the output of the voltage comparator may be at the second logic level a sample signal may be generated. According to a further embodiment, a voltage equalization switch may be coupled between the timing capacitor and the predetermined reference voltage, wherein when the sample signal may be generated the voltage equalization switch may turn on and may force the voltage on the timing capacitor to become substantially the same as the predetermined reference voltage. According to a further embodiment, a sample of the power inductor current may be taken when the sample signal may be generated.

According to yet another embodiment, a microcontroller for determining a power inductor current sample point in a buck switched-mode power supply (SMPS) may comprise: a constant current source having first and second nodes, wherein the first node thereof may be coupled to a voltage source; a constant current sink having first and second nodes, wherein the constant current sink may be twice the current value of the constant current source; a current source switch coupled between the second node of the constant current source and the first node of the constant current sink; a current sink switch coupled between the second node of the constant current sink and a voltage source common; a timing capacitor coupled between the first node of the constant current sink and the voltage source common; a voltage comparator having a first input coupled to a predetermined reference voltage, a second input coupled to the timing capacitor and an output, wherein the output thereof may be at a first logic level when the voltage on the timing capacitor may be greater than the predetermined reference voltage, and at a second logic level when the voltage on the timing capacitor may be equal to or less than the predetermined reference voltage; wherein when a high side switch signal from the SMPS goes to a first logic level the current source switch turns on and couples the constant current source to the timing capacitor, whereby a voltage on the timing capacitor increases; when the high side switch signal from the SMPS goes to a second logic level the current source switch turns off and decouples the constant current source from the timing capacitor, whereby the voltage on the timing capacitor stays the same; and when a 50% pulse width modulation (PWM) period signal from the SMPS may be received the current sink switch turns on and couples the constant current sink to the timing capacitor, whereby the voltage on the timing capacitor decreases twice as fast it increased when the high side switch signal may be at the second logic level, and when the high side switch signal may be at the first logic level the voltage on the timing capacitor decreases at the same rate as it increased.

BRIEF DESCRIPTION OF THE DRAWINGS

A more complete understanding of the present disclosure may be acquired by referring to the following description taken in conjunction with the accompanying drawings wherein.

Figure 1:
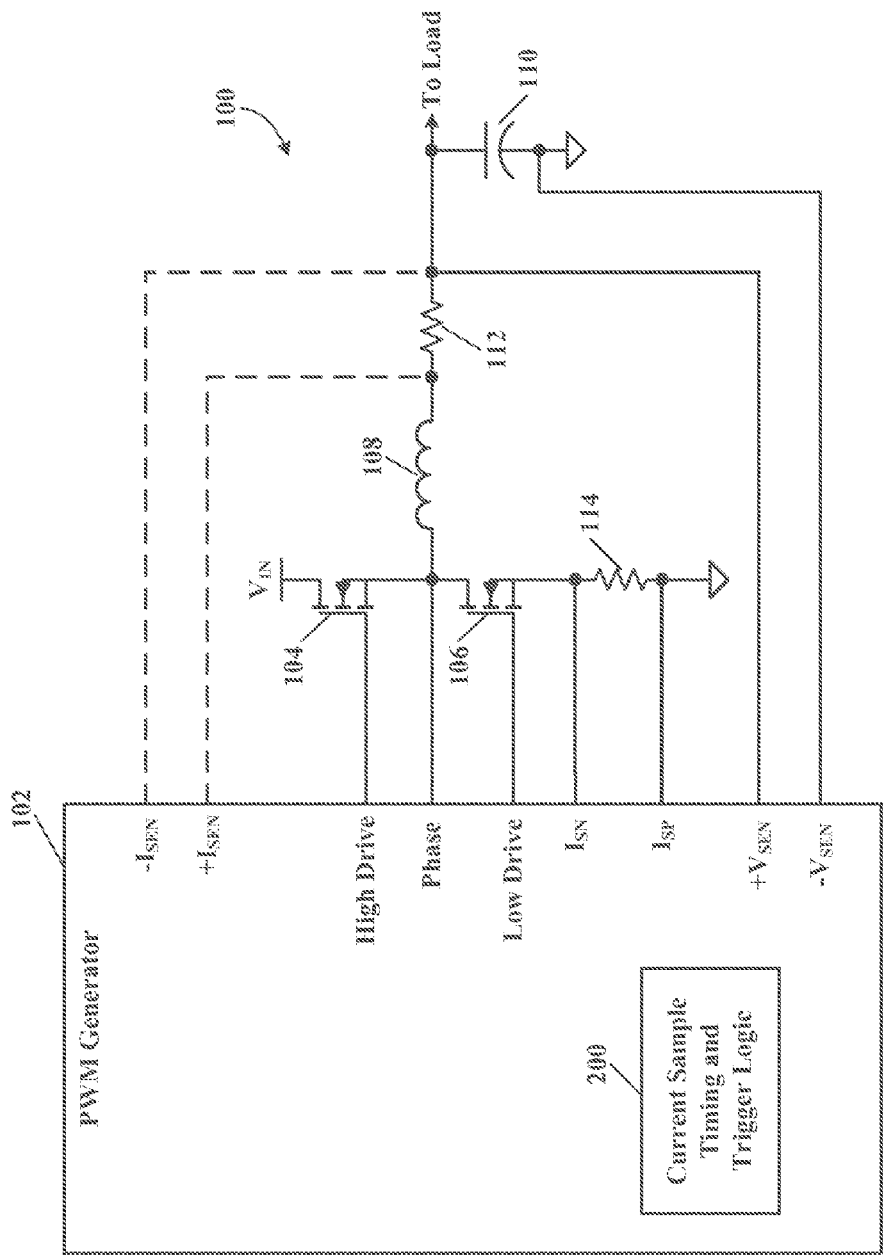
FIG. 1 illustrates a schematic diagram of a buck switched-mode power supply (SMPS), according to specific example embodiments of this disclosure.

While the present disclosure is susceptible to various modifications and alternative forms, specific example embodiments thereof have been shown in the drawings and are herein described in detail. It should be understood, however, that the description herein of specific example embodiments is not intended to limit the disclosure to the particular forms disclosed herein.

DETAILED DESCRIPTION

According to various embodiments of this disclosure, a sample and hold circuit takes a sample of the current flowing through an inductor of a buck switched-mode power supply (SMPS) at substantially the middle of the low side portion (50 percent point during low side switch ON) of the pulse width modulation (PWM) period. This sample of the current through the SMPS inductor during the low side ON 50% point may be considered as the "average" or "DC output" current of the SMPS. And preferably should be taken at precisely the same low side ON 50% point every time the SMPS inductor current is sampled.

The SMPS may use an emulated current mode control architecture. Instead of a current ramp that is generated from the current through a sense element, the average output current is summed together with a slope compensation ramp. The output of the summed current waveforms will then be compared to an error amplifier output. Thus the average load current taken at the 50 percent point of the low side ON of every PWM period may be used in controlling the SMPS. At a high level the problem of determining or measuring the average load current comes down to timing. When should the sensed current be sampled to provide the average load current? This sampling has to happen at substantially the same time every cycle (PWM period) and happen at the mid-point of the low-side switch, e.g., metal oxide semiconductor field effect transistor (MOSFET), on time. Any cycle-by-cycle or mid-point timing shifts will result in errors in the measured average output current.

The average system load current is needed not only for the PWM generation control system but also as a value that can be measured by an analog-to-digital converter (ADC) for conversion to a digital value representing the analog current sample. However, the ADC conversion may take longer than a PWM period, therefore converting a sample of the inductor current every $n^{th}$ time the 50% point occurs may be necessary. Taking a plurality of samples of the low side ON 50% point more than on the $n^{th}$ time of the PWM period and averaging these samples for later conversion by the ADC is also contemplated and within the scope of this disclosure. This technique (method) for sampling of the inductor current during the low side ON 50% point provides highly accurate and repeatable samples of the average inductor current in an integrated solution compared with present technology inductor current sampling methods.

It is desired to have this ADC measurement as accurate as possible and therefore happen at a time when neither power switching transistor, e.g., power MOSFET, driver is switching. A good time to start the ADC conversion would be when a SAMPLE signal is given since this occurs at the mid-point of the low drive time.

To provide the high degree of sample timing accuracy required, constant current charging and discharging of a timing capacitor in combination with a high speed analog voltage comparator may be utilized. A 50 percent point of the PWM period is easily provided by a clock running at twice the frequency (period=1/frequency) of the PWM period, e.g., PWM period time is derived by dividing by two the 50 percent point generating clock.

Referring now to the drawings, the details of example embodiments are schematically illustrated. Like elements in the drawings will be represented by like numbers, and similar elements will be represented by like numbers with a different lower case letter suffix.

Referring to FIG. 1, depicted is a schematic diagram of a buck switched-mode power supply (SMPS), according to specific example embodiments of this disclosure. A buck SMPS, generally represented by the numeral 100, may comprise a pulse width modulation (PWM) generator 102, a high side switch (e.g., power MOSFET) 104, a low side switch (e.g., power MOSFET 106), a power inductor 108, and an output filter capacitor 110. Output voltage may be sensed (+VsEN, −VsEN) across the output filter capacitor 110. Output current may be determined by either measuring the current through inductor 108, e.g., using the voltage drop across resistor 112 (+IsEN, −IsEN) or the inductor 108 resistance itself; or the current through the low side switch 106, e.g., using the voltage drop across resistor 114 (IsN, Isp). Determination of exactly when to take a current measurement is determined by a current sample timing and trigger logic 200, according to specific example embodiments of this disclosure. It is contemplated and within the scope of this disclosure that the PWM generator 102 and the current sample timing and trigger logic 200 may be part of or function in cooperation with a microcontroller. More details and information on PWM generation is available at the Assignee's website www.microchip.com, e.g., Application Notes AN1050, AN564 and the like, and are incorporated by reference herein for all purposes.

Figure 2:
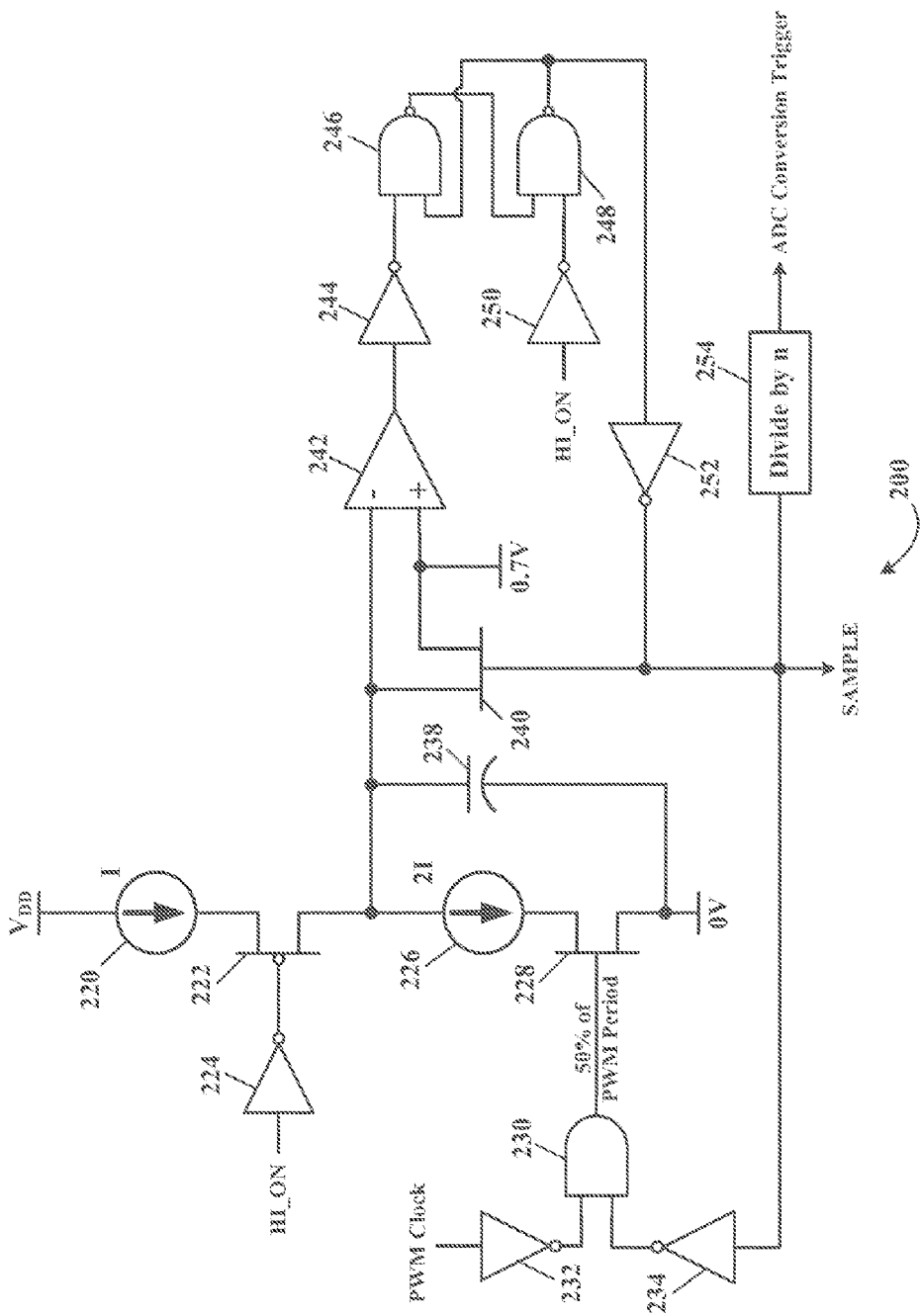
FIG. 2 illustrates a schematic diagram of a current sample timing and trigger logic, according to a specific example embodiment of this disclosure.

Referring to FIG. 2, depicted is a schematic diagram of a current sample timing and trigger logic, according to a specific example embodiment of this disclosure. A current sample timing and trigger logic, generally represented by the numeral 200, may comprise a constant current source 220, a charge switch (FET) 222, a constant current sink 226, a discharge switch (FET) 228, timing capacitor 238, discharge switch (FET) 240, analog input voltage comparator 242, prescaler (n-divider) 254, NAND gates 246 and 248, AND gate 230, and inverters 224, 232, 234, 244, 250 and 252. It is contemplated and with the scope of this disclosure that there may be other and different circuit configurations that can perform the same functions as the circuit shown in FIG. 2, and may be designed by one having ordinary skill in electronic circuit design and the benefit of this disclosure.

When the charge switch 222 turns on the constant current source 220 will start charging the timing capacitor 238 at a constant current of I wherein a charge on the timing capacitor 238 will linearly increase over time to produce a charge voltage. When the discharge switch 228 turns on the constant current sink 226 will start discharging the charge on the timing capacitor 238. When the charge and discharge switches 222 and 228, respectively, are both on the charge/discharge of the timing capacitor 226 will be the current difference between the constant current source 220 and constant current sink 226. Since the constant current sink 226 has a constant current value of 2I, and the constant current source 220 has a constant current value of I, when both switches 222 and 228 are on the timing capacitor 238 will be discharged at a constant current of I. When only switch 222 is on the constant current source 220 will charge the timing capacitor 238 at a constant current of I. When only switch 228 is on the constant current sink 226 will discharge the timing capacitor 238 at a constant current of 2I.

The SAMPLE signal from the current sense path will occur at a rate equal to the switching frequency of the PWM signal. When a SAMPLE signal is generated by the logic shown in FIG. 2, it also may control switch 240 to pre-charge the timing capacitor 238 (voltage equalize) to a reference voltage also coupled to the non-inverting input of the voltage comparator 242. This reference voltage may be, for example but is not limited to, 0.7 volts (V), according to one embodiment. However, other reference voltages such as, for example, 0.0 volts may be used.

The PWM period may be faster than an analog-to-digital converter (ADC) (not shown) takes to convert the analog current sample to a digital representation thereof. Therefore a prescaler 254 (divide by n circuit) may be needed between the SAMPLE signal and the ADC conversion trigger signal used to initiate an ADC conversion. Samples of the analog current values may still be taken at every low side 50% point and averaged together, however, for conversion by the ADC. Using the flip-flop circuit comprising NAND gates 230 and 234 and inverters 232 and 236, the 50% PWM period signal will turn on the switch 228 that will remain on until the SAMPLE signal is asserted.

Figure 3:
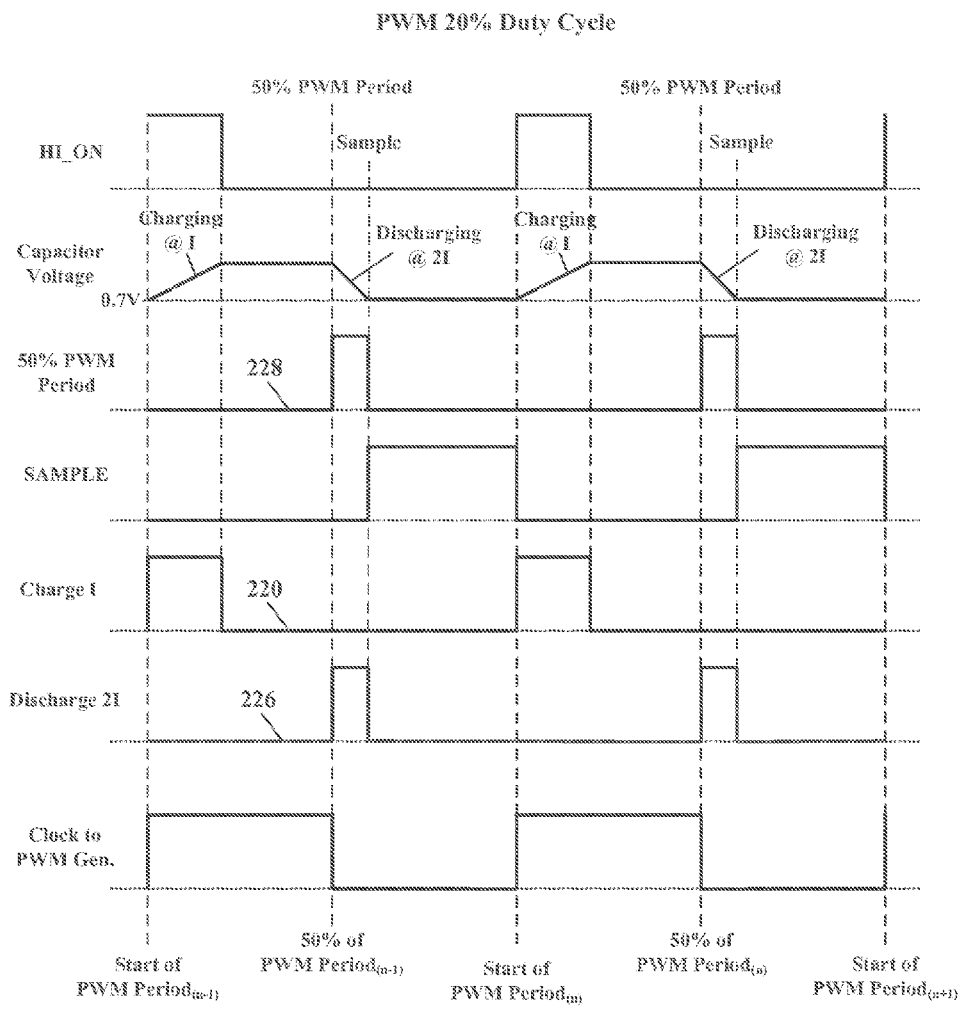
FIG. 3 illustrates a schematic timing diagram of the current sample timing and trigger logic shown in FIG. 2 at a 20 percent PWM duty cycle, according to specific example embodiments of this disclosure.

Referring to FIG. 3, depicted is a schematic timing diagram of the current sample timing and trigger logic shown in FIG. 2 at a 20 percent PWM duty cycle, according to specific example embodiments of this disclosure. When the PWM duty cycle is less than 50% the SAMPLE signal is generated according to the following description and is depicted in FIG. 3. The capacitor 238 is charged with a constant current equal to I from the constant current source 220 only when the high drive (HI_ON) is asserted (on) (high-side switch 104 on), causing the charge switch 222 to conduct (turn on), thereby coupling the constant current source 220 to the timing capacitor 238. The timing capacitor 238 is already charged to 0.7V wherein the constant charging current I will further increase the voltage charge thereon. The charging switch 222 remains on and the constant current source 220 remains coupled to the timing capacitor 238 until the high drive (HI_ON) is de-asserted (off) (high-side switch 104 off).

If the high-side switch 104 turns off before the PWM switching period has reached 50%, then the charging switch 222 turns off and the charge on the capacitor 238 is held. With no current source 220 and/or current sink 226 coupled to the timing capacitor 238, it will maintain the charge (voltage) thereon. When the PWM switching period reaches 50%, switch 228 turns on and the current sink 226 is coupled to the timing capacitor 238, thereby discharging the voltage charge thereon at a constant current rate of 2I. Thus capacitor 238 discharges twice as fast as it was charged. When the voltage charge on the capacitor 238 is 0.7V, the point in time is reached were the load current is sampled. This sampling point coincides with the mid-point of the low-side switch 106 conduction time.

Starting at the PWM period 50% point the voltage on the timing capacitor 238 continues to decrease so long as the constant current sink 226 is coupled to it and until the voltage on the timing capacitor 238 reaches 0.7V, wherein the voltage comparator 242 output will go high, the inverter 244 output will go low and the output of the NAND gate 246 will go high. This will cause the output of the NAND gate 248 to go low since the high drive (HI_ON) is de-asserted (off). When the output of the NAND gate 248 goes low, the output of the inverter 252 goes high and a SAMPLE signal is generated, causing the FET switch 240 to turn on, thereby resetting the voltage on the timing capacitor 238 back to 0.7V, if at a different voltage. The SAMPLE signal goes high at the midpoint of when the low side switch 106 is on. Thus a sample of the current through the inductor 108 is taken at the midpoint or average of the inductor current.

Figure 4:
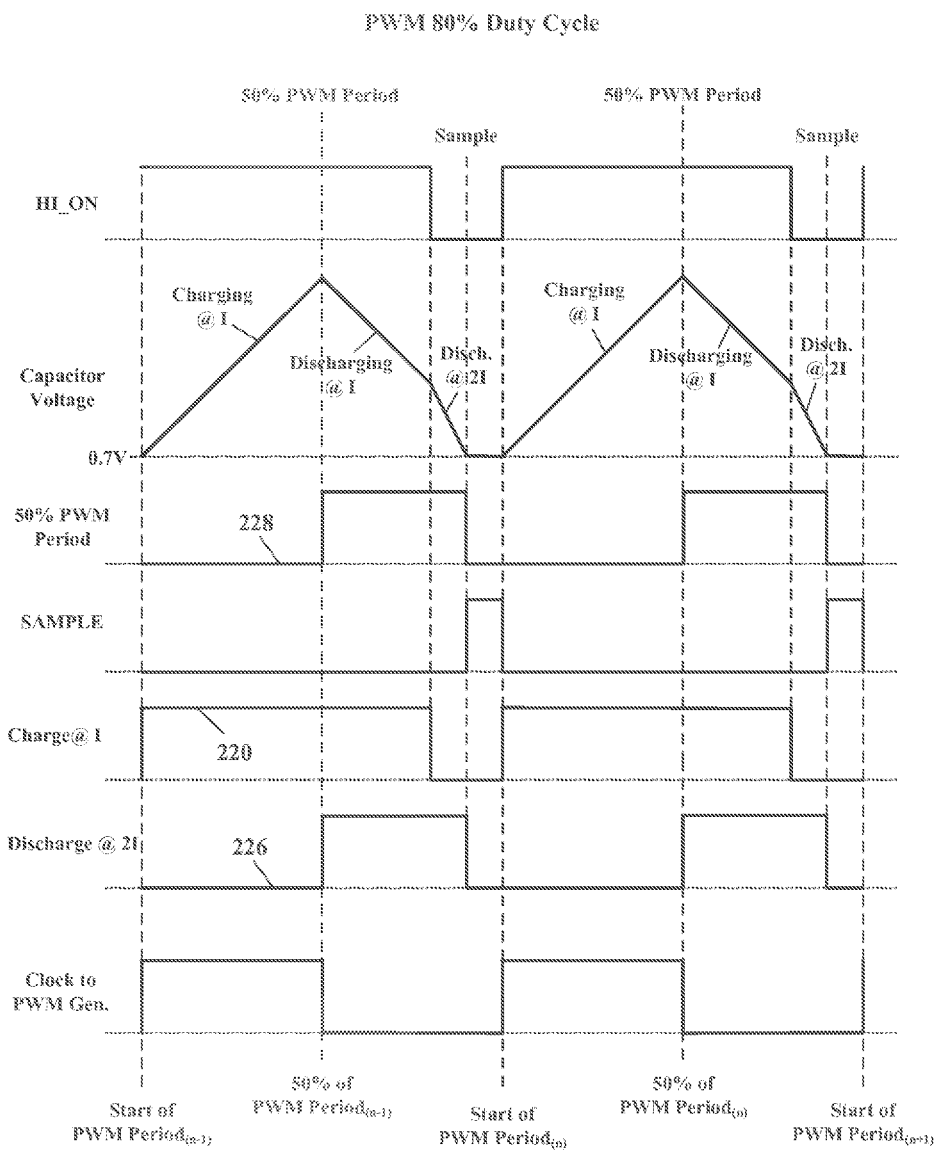
FIG. 4 illustrates a schematic timing diagram of the current sample timing and trigger logic shown in FIG. 2 at an 80 percent PWM duty cycle, according to specific example embodiments of this disclosure.

Referring to FIG. 4, depicted is a schematic timing diagram of the current sample timing and trigger logic shown in FIG. 2 at an 80 percent PWM duty cycle, according to specific example embodiments of this disclosure. When the PWM duty cycle is greater than 50%, the SAMPLE signal is generated according to the following description and is depicted in FIG. 4. The capacitor 238 is charged with a constant current equal to I from the constant current source 220 only when the high drive (HI_ON) is asserted (on) (high-side switch 104 on), causing the charge switch 222 to conduct (turn on), thereby coupling the constant current source 220 to the timing capacitor 238. The timing capacitor 238 is already charged to 0.7V wherein the constant charging current I will further increase the voltage charge thereon. Charging switch 222 remains on and the constant current source remains coupled to the timing capacitor 238 until the high drive (HI_ON) is de-asserted (off). At the PWM period 50% point, switch 228 is turned on and the current sink 226 is also coupled to the timing capacitor 238, thereby discharging the voltage charge thereon at a constant current rate of I since the current source 220 remains coupled to the timing capacitor 238.

Once the high-side switch 104 is turned off, the switch 222 will be turned off by the high side drive (HI_ON) going low. Then voltage on the timing capacitor 238 will decrease at twice the rate it was charged at until the voltage on the timing capacitor 238 reaches 0.7V. Wherein the voltage comparator 242 output will go high, the inverter 244 output will go low and the output of the NAND gate 246 will go high. This will cause the output of the NAND gate 248 to go low since the high drive (HI_ON) is de-asserted (off). When the output of the NAND gate 248 goes low, the output of the inverter 252 goes high and a SAMPLE signal is generated, thereby resetting the voltage on the timing capacitor 238 back to 0.7V if at a different voltage. The SAMPLE signal goes high at the midpoint of when the low side switch 106 is on. Thus a sample of the current through the inductor 108 is taken at the midpoint or average of the inductor current.

Figure 5:
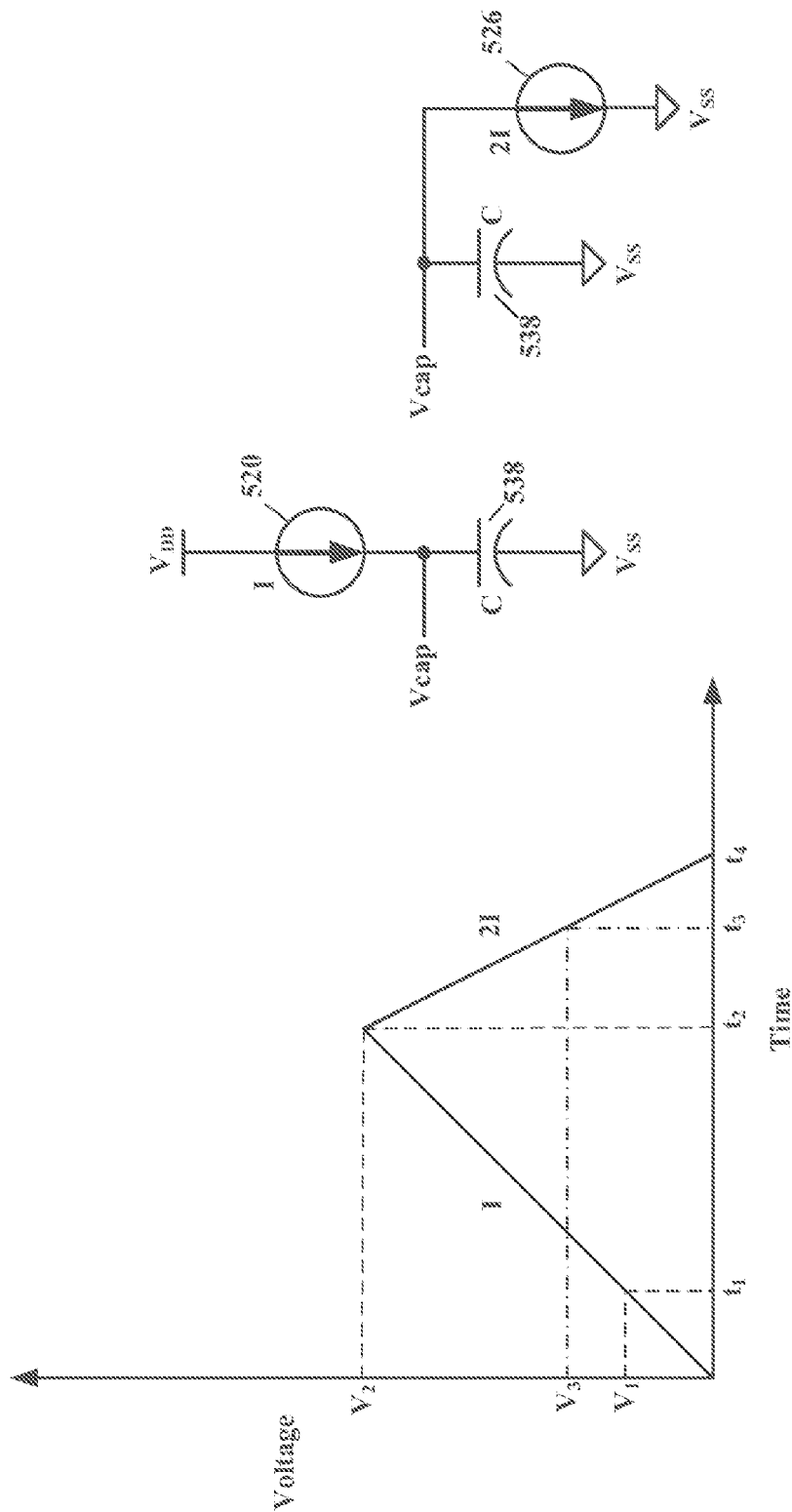
FIG. 5 illustrates a schematic time-voltage graph of a capacitor being charged and discharged from a constant current source and sink, according to specific example embodiments of this disclosure.

Referring to FIG. 5, depicted is a schematic time-voltage graph of a capacitor being charged and discharged from a constant current source and sink, according to specific example embodiments of this disclosure. The function of the analog timing circuit shown in FIG. 2 may better be understood by referring to FIG. 5, wherein a time-voltage graph of a capacitor 538 being charged from a constant current source 520 and discharged by a constant current sink 526 is depicted. When the capacitor 538 is charged through the constant current source 520, the voltage, Vcap, across the capacitor 518 increases linearly with time, according to the equation: I=C*dV/dt, where C is the capacitance value of the capacitor 538, I is the current from the constant current source 520 and V is the voltage on the capacitor 538 at time t. When any two values of the current, I; time, t; and voltage, V are known, the other unknown value may be calculated from the two known values. For example, if the capacitance of the capacitor 538 and the charging current from the constant current source 520 are known, then the time $t_1$ at voltage $V_1$ and the time $t_2$ at voltage $V_2$ may be determined using equation (1) above. Similarly, the voltage on the capacitor 538 may be discharged by coupling the constant current sink 526 thereto. When the constant current sink 526 has a constant current of 2I or twice the constant current value of the constant current source 520, the timing capacitor 538 will be discharged (2I) twice as fast as it was charged at constant current I. If the constant current sink 526 is substantially twice the current value of the constant current source 520, the timing capacitor 538 will always be discharged at twice the rate at which it was charged when only the constant current sink 526 is coupled thereto. A more general use description of applications for constant current charging and discharging of a timing capacitor are more fully described in Microchip application notes AN1250 and AN1375, available at www.microchip.com, and commonly owned U.S. Pat. No. 7,460,441 B2, entitled "Measuring a long time period;" and U.S. Pat. No. 7,764,213 B2, entitled "Current-time digital-to-analog converter," both by James E. Bartling; wherein all are hereby incorporated by reference herein for all purposes.

Figure 6:
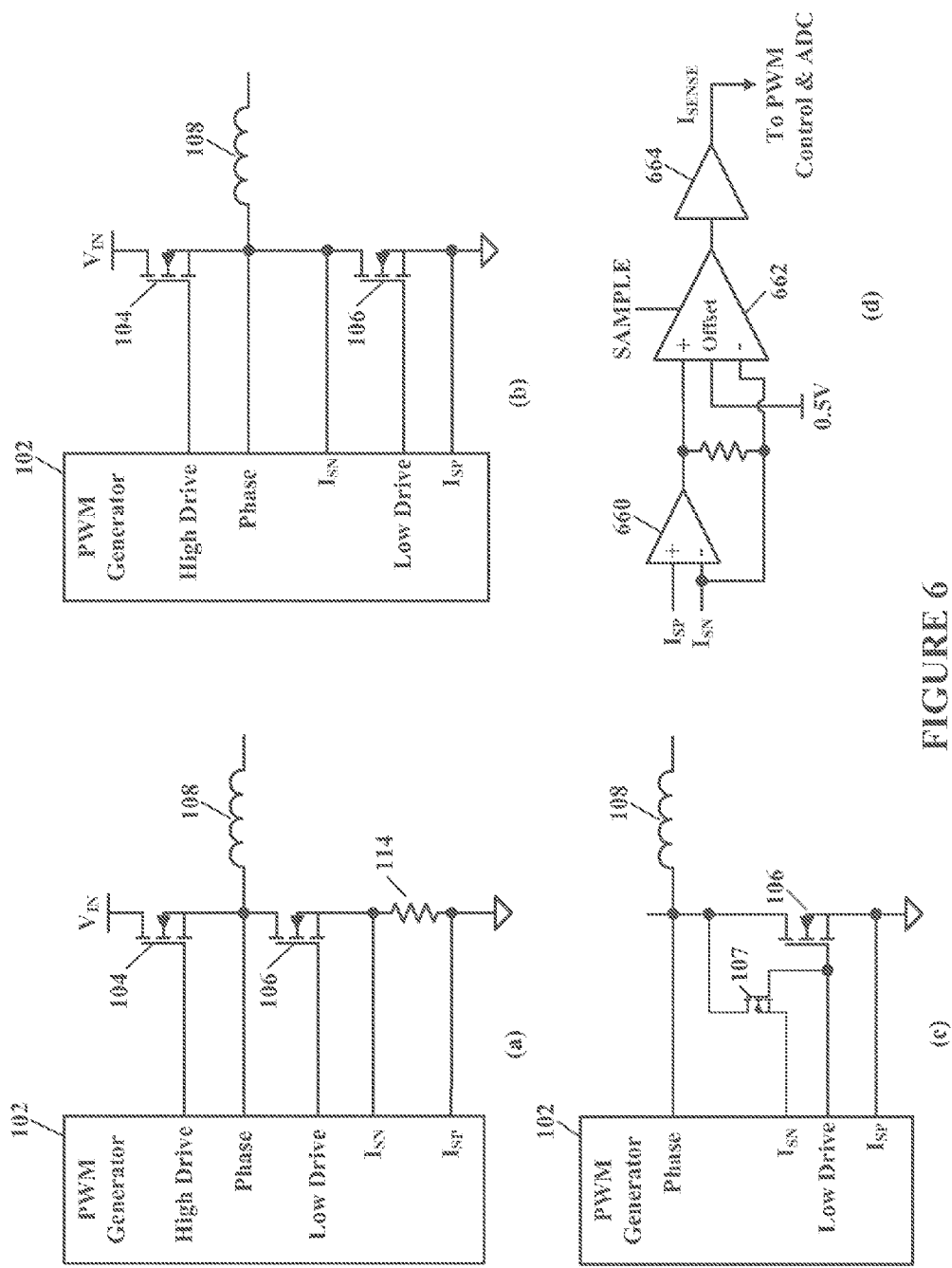
FIG. 6 illustrates schematic diagrams of inductor current measuring circuits, according to specific example embodiments of this disclosure.

Referring to FIG. 6, depicted are schematic diagrams of inductor current measuring circuits, according to specific example embodiments of this disclosure. A current measuring circuit is shown in FIG. 6(a) wherein a resistor 114 develops a voltage when low side current passes therethrough. In FIG. 6(b) the internal resistance of the switch (FET) 106 is used instead of resistor 114. In FIG. 6(c) a sense or pilot FET 107 may be used as the current sense element. The current through the small pilot FET 107 may be used instead of the voltage developed across the resistor 114. The pilot FET 107 may be built into or co-packaged with the main power FET 106 and typically has a much larger RDSon than the main power FET 106. For example, this design may be capable of sensing current with the pilot FET 107 to the power FET 106 with an RDSon ratio of 10,000:1. All of these current measurement circuits provide an analog parameter indication of the current through the inductor 108 during low side switch 106 conductance.

Referring to FIG. 6(d), the inductor current signal on input terminals IsN and Isp may be applied to a differential input amplifier 660 and then to a sample and hold circuit 662 that may take a voltage sample every SAMPLE signal assertion, and may have a voltage offset introduced, e.g., 0.5V. The voltage offset is used so that the error amplifier can control narrow duty cycles under light load conditions. Typically, even rail-to-rail output amplifiers cannot drive all the way to the voltage rail. This voltage offset allows the error amplifier to maintain control over all duty cycle conditions. Amplifier 664 may further condition and/or amplify an $I_{SENSE}$ signal for conversion by an ADC (not shown). The ADC may convert the $I_{SENSE}$ signal to a digital representation thereof every $n^{th}$ time the SAMPLE signal occurs. Samples of the analog current values may be taken at every low side 50% point and averaged together before being converted to a digital value by the ADC.

Figure 7:
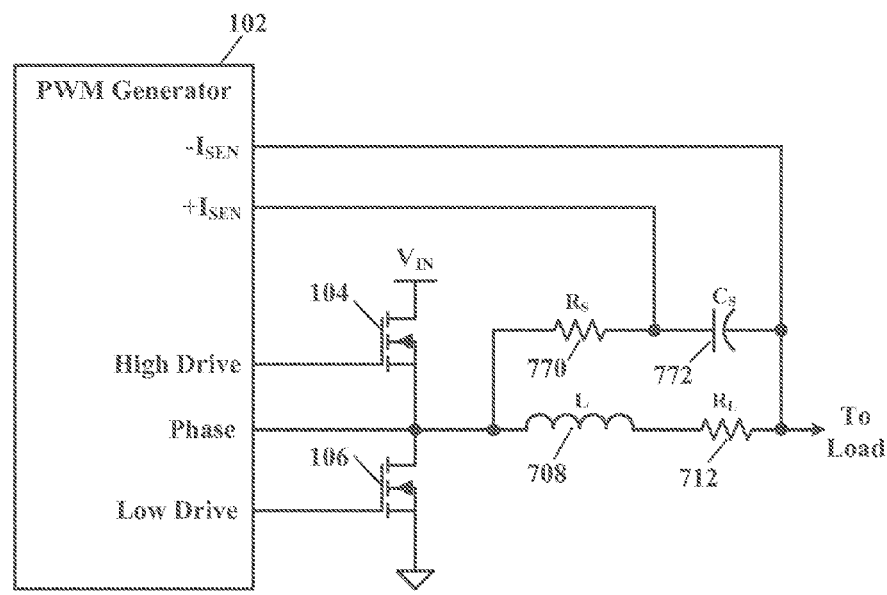
FIG. 7 illustrates schematic diagrams of inductor current measuring circuits, according to other specific example embodiments of this disclosure.
Figure 7:
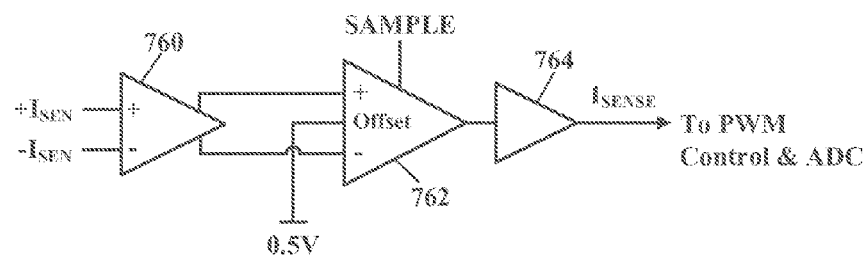

Referring to FIG. 7, depicted are schematic diagrams of inductor current measuring circuits, according to other specific example embodiments of this disclosure. An inductor current sense element can be either a resistor 112 (FIG. 1) in series with the output to the load, or the series resistance 712 of the inductor 708. If the series resistance 712 of the inductor 708 is used, an RC filter may be placed around the inductor 708 as shown in FIG. 7(a). The value of resistor 770 ($R_S$) and capacitor 772 ($C_S$) may be determined by using the following formula:

$$L/R_L = R_S \times C_S,$$

where
L is the inductance value of the output inductor 708,
$R_L$ is the series resistance 712 of the output inductor 708,
$R_S$ is the current sense filter resistor 770, and
$C_S$ is the current sense filter capacitor 772.

When the current sense filter time constant is set equal to the inductor time constant, the voltage appearing across capacitor 772 (Cs) approximates the current flowing in the inductor 708 multiplied by the series resistance 712 of the inductor 708.

Referring to FIG. 7(b), the inductor current signal on input terminals IsN and Isp may be applied to a differential input amplifier 760 and then to a sample and hold circuit 762 that may take a voltage sample every SAMPLE signal assertion, and may have a voltage offset introduced, e.g., 0.5V. The voltage offset is used so that the error amplifier can control narrow duty cycles under light load conditions. Typically, even rail-to-rail output amplifiers cannot drive all the way to the voltage rail. This voltage offset allows the error amplifier to maintain control over all duty cycle conditions. Both sampled current and measured output current may be used for control. Amplifier 764 may further condition and/or amplify an $I_{SENSE}$ signal for conversion by an ADC (not shown). The ADC may convert the $I_{SENSE}$ signal to a digital representation thereof every $n^{th}$ time the SAMPLE signal occurs. Samples of the analog current values may be taken at every low side 50% point and averaged together before being converted to a digital value by the ADC.

The entire circuit described herein may be preferably implemented within a microcontroller having an ADC, PWM generator and charge time measurement unit (CTMU). Configurable logic may be present in the microcontroller to allow a configuration according to one of the embodiments discussed above. However, specific implementations of the CTMU may already provide for the required circuitry. Firmware may control the respective circuits to automatically measure the current with very little software overhead in particular for SMPS applications.

The invention claimed is:
1. An apparatus for determining a power inductor current sample point in a buck switched-mode power supply (SMPS), comprising:
a constant current source having first and second nodes, wherein the first node thereof is coupled to a voltage source;
a constant current sink having first and second nodes, wherein the constant current sink is twice the current value of the constant current source;
a current source switch coupled between the second node of the constant current source and the first node of the constant current sink;
a current sink switch coupled between the second node of the constant current sink and a voltage source common;
a timing capacitor coupled between the first node of the constant current sink and the voltage source common;
a voltage comparator having a first input coupled to a predetermined reference voltage, a second input coupled to the timing capacitor and an output, wherein the output thereof is at a first logic level when the voltage on the timing capacitor is greater than the predetermined reference voltage, and at a second logic level when the voltage on the timing capacitor is equal to or less than the predetermined reference voltage; wherein
when a high side switch signal from the SMPS goes to a first logic level the current source switch turns on and couples the constant current source to the timing capacitor, whereby a voltage on the timing capacitor increases;
when the high side switch signal from the SMPS goes to a second logic level the current source switch turns off and decouples the constant current source from the timing capacitor, whereby the voltage on the timing capacitor stays the same; and
when a 50% pulse width modulation (PWM) period signal from the SMPS is received the current sink switch turns on and couples the constant current sink to the timing capacitor, whereby the voltage on the timing capacitor decreases twice as fast it increased when the high side switch signal is at the second logic level, and when the high side switch signal is at the first logic level the voltage on the timing capacitor decreases at the same rate as it increased.

2. The apparatus according to claim 1, wherein when the output of the voltage comparator is at the second logic level a sample signal is generated.

3. The apparatus according to claim 2, further comprising a voltage equalization switch coupled between the timing capacitor and the predetermined reference voltage, wherein when the sample signal is generated the voltage equalization switch turns on and forces the voltage on the timing capacitor to become substantially the same as the predetermined reference voltage.

4. The apparatus according to claim 3, wherein a sample of the power inductor current is taken when the sample signal is generated.

5. A microcontroller comprising the apparatus of claim 1.
6. A switched-mode power supply (SMPS) comprising:
high side and low side switches coupled in series between a supply voltage and common, and a power inductor coupled between a junction of the high side and low side switches and a load, a current sampling timing and trigger logic circuit comprising:

a timing capacitor configured to be coupled with a first constant current source when the high side switch is on and to be discharged when a pulse width modulation (PWM) period of the SMPS reaches 50% and the high side switch is on; and wherein the timing capacitor is further configured to be discharged with a second constant current when the PWM period reaches 50% and the high side switch is off, wherein the second constant current is twice the first constant current; and wherein the current sampling timing and trigger logic circuit is further configured to sample a power inductor current when a voltage on the timing capacitor reaches a predetermined reference voltage.

7. The system according to claim 6, wherein the timing capacitor is further configured not to be charged or discharged when the high side switch is off and the PWM period is less than 50%.

8. The system according to claim 6, wherein said timing capacitor is further configured to be pre-charged to the reference voltage when the power inductor current is sampled.

9. The system according to claim 6, further comprising an analog-to-digital converter (ADC) configured to convert the power inductor current sample into a digital representation thereof.

10. The system according to claim 6, comprising a current measurement resistor between the low side switch and the supply common; and wherein the system is configured to sample a voltage developed across the current measurement resistor when the voltage on the timing capacitor reaches the predetermined reference voltage.

11. The system according to claim 6, wherein the high side and low side switches are power transistors.

12. The system according to claim 11, wherein the power transistors are metal oxide semiconductor field effect transistors (MOSFETs).

13. The system according to claim 12, wherein the system is configured to sample a voltage developed across the low side MOSFET when the voltage on the timing capacitor reaches the predetermined reference voltage.

14. The system according to claim 12, further comprising a pilot field effect transistor (FET) associated with the low side MOSFET, wherein the pilot FET has a small portion of the power inductor current flowing therethrough; and wherein the system is configured to sample a voltage developed across the pilot FET and the low side MOSFET when the voltage on the timing capacitor reaches the predetermined reference voltage.

15. The system according to claim 6, further comprising a current measurement resistor in series with the power inductor; and wherein the system is configured to sample a voltage developed across the current measurement resistor when the voltage on the timing capacitor reaches the predetermined reference voltage.

16. The system according to claim 6, wherein the system is configured to sample a voltage across the power inductor when the voltage on the timing capacitor reaches the predetermined reference voltage.

17. The system according to claim 6, wherein the predetermined threshold voltage is approximately zero (0) volts.

18. The system according to claim 6, wherein the system is configured to generate a sample signal when the voltage on the timing capacitor reaches the predetermined reference voltage.

19. The system according to claim 6, further comprising an analog-to-digital converter (ADC) configured to convert the power inductor current sample into a digital representation thereof every $n^{th}$ time the voltage on the timing capacitor reaches the predetermined reference voltage.

* * * * *